(12) United States Patent
Ohshima

(10) Patent No.: US 7,203,046 B2
(45) Date of Patent: Apr. 10, 2007

(54) OVERCURRENT DETECTING DEVICE

(75) Inventor: Shunzou Ohshima, Toyota (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/318,928

(22) Filed: Dec. 28, 2005

(65) Prior Publication Data

US 2006/0158817 A1   Jul. 20, 2006

(30) Foreign Application Priority Data

Jan. 17, 2005   (JP)   ............... P2005-009060

(51) Int. Cl.
*H02H 3/08*   (2006.01)
*H02H 9/02*   (2006.01)

(52) U.S. Cl. ............... 361/93.1; 361/18; 361/98; 324/354; 324/522

(58) Field of Classification Search ............... 361/93.1, 361/18; 324/98, 354, 522
See application file for complete search history.

(56) References Cited

U.S. PATENT DOCUMENTS 4,937,697 A * 6/1990 Edwards et al. ............... 361/18

6,867,576 B2 * 3/2005 Dubhashi ............... 324/76.79

FOREIGN PATENT DOCUMENTS

| JP | 9-218701 A | 8/1997 |
|---|---|---|
| JP | 2000-312142 A | 11/2000 |
| JP | 2001-298849 A | 10/2001 |

* cited by examiner

*Primary Examiner*—Brian Sircus
*Assistant Examiner*—Zeev Kitov
(74) *Attorney, Agent, or Firm*—Sughrue Mion, PLLC

(57) ABSTRACT

An overcurrent detecting device for detecting an overcurrent in a load circuit, includes a DC power supply, a load, a semiconductor switch that controls ON/OFF of the load, a driver circuit that outputs a driving signal to the semiconductor switch, a reference voltage generating circuit that generates a reference voltage from the DC power supply, a voltage drop generating circuit that includes a resistor for generating a voltage drop and generates a voltage drop in the resistor for generating a voltage drop, a decision voltage generating circuit that generates, as a decision voltage, a voltage corresponding to a voltage obtained by adding a voltage drop generated when the semiconductor switch is turned ON and a voltage drop generated in the resistor for generating a voltage drop, and a comparing circuit that compares the decision voltage with the reference voltage and outputs a disconnecting command signal of the semiconductor switch to the driver circuit when the decision voltage is greater than the reference voltage.

4 Claims, 3 Drawing Sheets

OVERCURRENT DETECTING DEVICE

BACKGROUND OF THE INVENTION

The present invention relates to an overcurrent detecting device for detecting an overcurrent flowing to a DC circuit using a semiconductor switch and more particularly to a technique capable of detecting an overcurrent with high precision corresponding to a change in an ON-state resistance of a semiconductor switch if any.

For example, in a DC circuit provided with a semiconductor switch such as an FET between a DC power supply and a load of a motor or a lamp and serving to turn ON/OFF the semiconductor switch, thereby controlling the driving operation of the load, an overcurrent detecting circuit is provided for detecting an overcurrent such as a short-circuit current when it flows and for immediately disconnecting the semiconductor switch to protect the circuit when detecting the overcurrent.

FIG. 3 is a circuit diagram showing the structure of a load driving circuit mounting a related overcurrent detecting circuit. A DC power supply VB shown in FIG. 3 is a battery to be mounted on a vehicle, for example, and a load 101 is a motor for driving a power window or various lamps which is/are mounted on the vehicle, for example, and the DC power supply VB and the load 101 are connected to each other through an MOS type FET (T101).

Moreover, a voltage V1 is applied to an output terminal on the positive side of the DC power supply VB and the output terminal on the positive side is connected to a terminal of an IC circuit 102. Furthermore, the output terminal on the positive side of the DC power supply VB is grounded through a series circuit of resistors R101 and R102, and a node (a voltage V4) is connected to a terminal b of the IC circuit 102.

Furthermore, the FET (T101) has a gate connected to a terminal c of the IC circuit 102 and a source (a voltage V2) connected to a terminal d of the IC circuit 102.

The IC circuit 102 includes a series connection circuit having a resistor R103, an FET (T102) and a resistor R105, and one of the ends of the resistor R103 is connected to the terminal a (that is, the output terminal on the positive side of the DC power supply VB) and one of the ends of the resistor R105 is grounded. Furthermore, the IC circuit 102 has an amplifier (AMP101), and a drain (a voltage V3) of the FET (T102) is connected to an input terminal on the positive side of the amplifier (AMP101), the terminal d, that is, a source (a voltage V2) of the FET (T101) is connected to an input terminal on the negative side of the amplifier (AMP101) and an output terminal of the amplifier (AMP101) is connected to the gate of the FET (T102).

Moreover, a comparator (CMP101) is provided, and a source of the FET (T102) is connected to an input terminal on the negative side of the comparator (CMP101), and the terminal b, that is, the node of the resistors R101 and R102 is connected to an input terminal on the positive side of the comparator (CMP101).

Furthermore, the IC circuit 102 includes a driver circuit 103, and an output terminal of the driver circuit 103 is connected through a resistor R110 to the terminal c, that is, the gate of the FET (T101).

By the control of the output signal of the driver circuit 103, a driving signal is supplied to the gate of the FET (T101) and the FET (T101) is thus turned ON/OFF.

A voltage VDS between the drain and the source of the FET (T101) when the FET (T101) is turned ON can be expressed in the following equation (1), wherein an ON-state resistance of the FET (T101) is represented by Ron and a drain current is represented by ID.

$$VDS = V1 - V2 = Ron * ID \quad (1)$$

The amplifier (AMP 101) in the IC circuit 102 outputs a control signal to the gate of the FET (T102) in such a manner that the voltage V2 is equal to the voltage V3, thereby controlling a current I1 to flow to the series circuit constituted by the resistor R103. Therefore, a voltage generated on both ends of the resistor R103 is controlled to be equal to the voltage VDS between the drain and the source.

For example, if the resistance value of the resistor R105 is set to be 100 times as great as that of the resistor R103 (for example, R103=100Ω, R105=10KΩ), furthermore, a voltage V5 is obtained by amplifying the voltage VDS to be 100 times as great. This can be expressed in the following equation (2).

$$V5 = (R5/R3) * Ron * ID \quad (2)$$

The voltage V5 is supplied to the input terminal on the negative side of the comparator (CMP101) and the voltage (a reference voltage) V4 obtained by dividing the voltage of the DC power supply VB by the resistors R101 and R102 is supplied to the input terminal on the positive side. When the voltage V5 is higher than the voltage V4, therefore, the output signal of the comparator (CMP101) is inverted. More specifically, when an overcurrent flows to the load 101 so that the current ID is increased, the voltage V5 is increased by the equation (2) and the voltage V4 is exceeded so that the output signal of the comparator (CMP101) is inverted. If the signal is detected to disconnect the FET (T101), consequently, it is possible to protect the load 101 and a circuit connected thereto.

There are various types of loads to be controlled by a semiconductor switch, and an FET is selected corresponding to the type of the load, particularly, the magnitude of a load current. When the type of the FET (T101) is varied, accordingly, the ON-state resistance Ron is changed. As is understood from the equation (2), therefore, the voltage V5 is varied. If the load 101 is identical, moreover, the magnitude of the current ID is not varied in the decision of the current ID to be an overcurrent. In order to decide the same current ID to be the overcurrent, therefore, it is necessary to change a value of (R5/R3) or the reference voltage V4 for the decision of the overcurrent corresponding to a new ON-state resistance Ron.

Since these changes cannot be carried out in the IC circuit 102, they are to be performed on the outside of the IC circuit 102. Therefore, it is impossible to incorporate the resistors R101 and R102 in the IC circuit 102.

If there is employed a structure in which the resistors R101 and R102 are provided on the outside of the IC circuit 102, however, it is necessary to provide at least one connecting terminal in the IC circuit 102 (terminal b). FIG. 3 shows only one load circuit for simplicity of explanation. If instrumentation equipment for a vehicle is supposed, there are actually ten load circuits or more. In such a case, consequently, it is necessary to provide ten connecting terminals or more in the IC circuit 102. Thus, there is a drawback that the size of an IC package is increased and that of a chip size is increased, resulting in an increase in a cost.

As described above, in the case in which the FET (T101) to be the semiconductor switch provided in the load circuit is varied so that the ON-state resistance Ron is changed, it is necessary to set a desired overcurrent decision value corresponding to a new ON-state resistance Ron. For this purpose, it is necessary to change the resistance values of the resistors R101 and R102, thereby setting the overcurrent decision value. This operation is to be carried out on the outside of the IC circuit 102 and two regulating terminals (terminals a and b) are to be provided in the IC circuit 102. Consequently, there is a problem in that the size of a package is increased.

SUMMARY OF THE INVENTION

The invention has been made in order to solve the problems and has an object to provide an overcurrent detecting device capable of setting an overcurrent decision value corresponding to a change in an ON-state resistance Ron by a simple method without increasing the size of an integrated circuit (IC circuit).

In order to achieve the object, according to the present invention, there is provided an overcurrent detecting device for detecting an overcurrent in a load circuit, the overcurrent detecting device comprising:

a DC power supply;
a load;
a semiconductor switch that controls ON/OFF of the load;
a driver circuit that outputs a driving signal to the semiconductor switch;
a reference voltage generating circuit that generates a reference voltage;
a voltage drop generating circuit that includes a resistor (R6) across which a desired voltage drop is generated;
a decision voltage generating circuit that generates, as a decision voltage (V5), a voltage corresponding to a voltage obtained by adding a voltage drop generated in the resistor (R6) to a voltage drop (VDS) generated when the semiconductor switch is turned ON; and
a comparing circuit that compares the decision voltage with the reference voltage and outputs a disconnecting command signal of the semiconductor switch to the driver circuit when the decision voltage is greater than the reference voltage.

A second aspect of the invention is directed to the overcurrent detecting device, wherein the driver circuit, the reference voltage generating circuit, the comparing circuit, the voltage drop generating circuit excluding the resistor for generating a voltage drop, and the decision voltage generating circuit are provided in a single integrated circuit.

A third aspect of the invention is directed to the overcurrent detecting device, wherein the integrated circuit includes three connecting terminals having a first terminal for connecting the driver circuit to the semiconductor switch, a second terminal for connecting the reference voltage generating circuit to the DC power supply, and a third terminal for connecting the resistor for generating a voltage drop to the voltage drop generating circuit provided in the integrated circuit.

A fourth aspect of the invention is directed to the overcurrent detecting device, wherein the voltage drop generating circuit includes a constant current circuit that causes a constant current to flow from the source terminal of the semiconductor switch through the resistor for generating a voltage drop so as to generate a desired voltage drop in the resistor.

A fifth aspect of the invention is directed to the overcurrent detecting device, wherein the semiconductor switch is an MOSFET.

According to the first aspect of the invention, it is possible to optionally set the overcurrent decision value of the current flowing to the load circuit by regulating the value of a resistance for generating a voltage drop. Also in the case in which the necessity of changing the ON-state resistance Ron of the semiconductor switch is generated, therefore, it is possible to set a desirable overcurrent decision value by the resistance for generating a voltage drop. Thus, it is possible to set the overcurrent decision value with high precision.

According to the second aspect of the invention, only the resistor for generating a voltage drop is provided on the outside of the integrated circuit and the other circuits are provided in the integrated circuit. Therefore, the size and weight of the whole device can be reduced.

According to the third aspect of the invention, there are three terminals for connecting the integrated circuit to the load circuit, that is, the first to third terminals. Consequently, the number of the terminals can be decreased and the size of the integrated circuit can be reduced. Thus, the cost of the whole device can be reduced.

According to the fourth aspect of the invention, it is possible to set a voltage drop to be generated in the resistor for generating a voltage drop by a constant current circuit and a current mirror circuit. Thus, it is possible to easily set a voltage drop with high precision.

According to the fifth aspect of the invention, the MOSFET is used as the semiconductor switch. Therefore, it is possible to reliably protect the MOSFET in the generation of an overcurrent.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
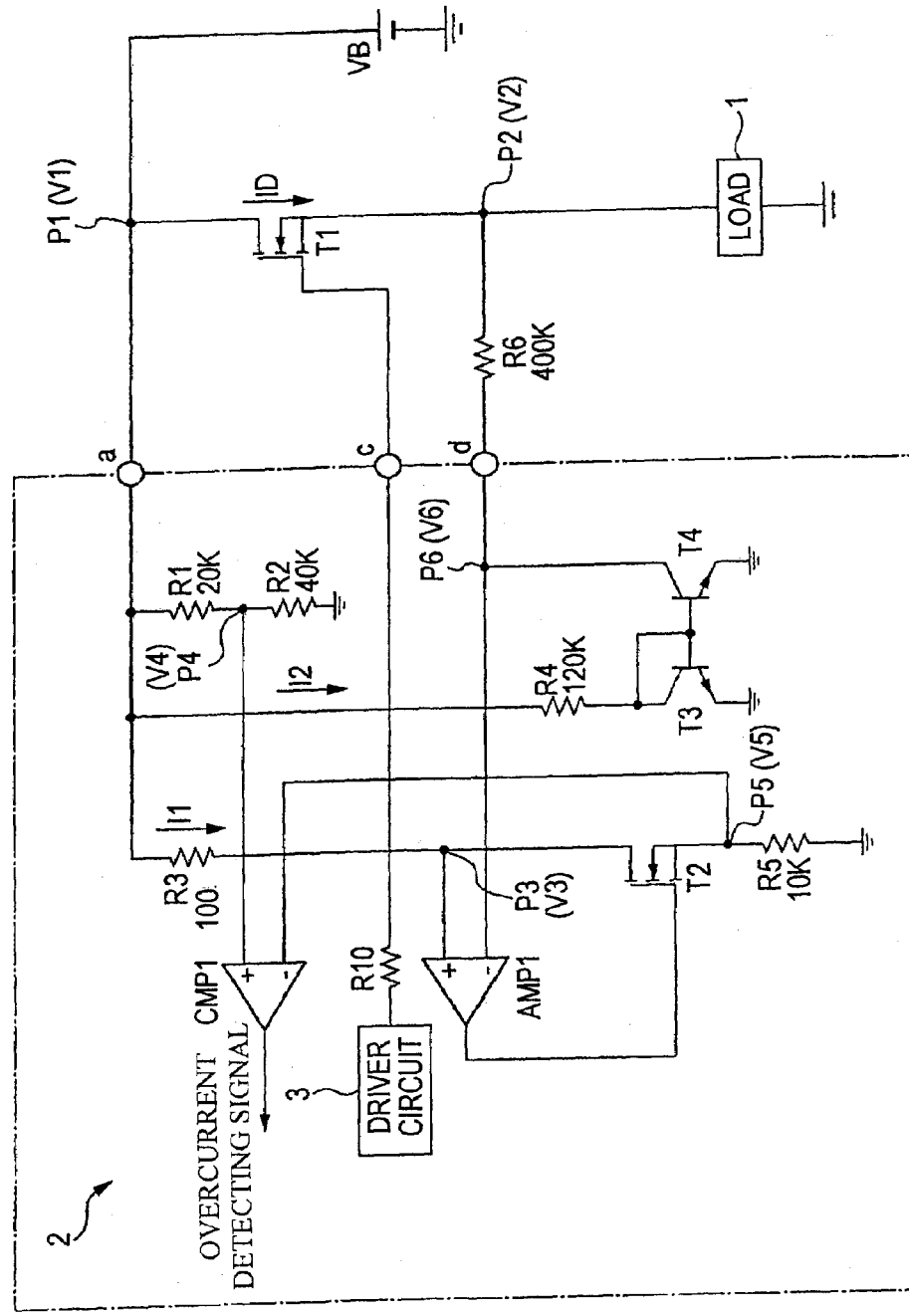
FIG. 1 is a circuit diagram showing an overcurrent detecting device and a load circuit according to an embodiment of the invention.

An embodiment of the invention will be described below with reference to the drawings. FIG. 1 is a circuit diagram showing the structure of a load circuit employing an overcurrent detecting device according to an embodiment of the invention.

As shown in FIG. 1, the load circuit has a series connection circuit including a DC power supply VB, an MOS type FET (T1; semiconductor switch) and a load 1, and the FET (T1) is turned to be ON or OFF, thereby controlling the driving operation of the load 1.

The DC power supply VB is a battery to be mounted on a vehicle, for example, and the load 1 is a motor for driving a power window or various lamps which is/are mounted on the vehicle. Moreover, the load circuit comprises an IC circuit (an integrated circuit) 2 and the driving operation of the FET (T1) is controlled by the IC circuit 2.

A node P1 (a voltage V1) of the drain of the FET (T1) and the DC power supply VB is connected to a terminal a (a second terminal) of the IC circuit 2, and a node P2 (a voltage V2) of the source of the FET (T1) and the load 1 is connected to a terminal d (a third terminal) of the IC circuit 2 through a resistor R6 (a resistor for generating a voltage drop) and the gate of the FET (T1) is connected to a terminal c (a first terminal) of the IC circuit 2.

The IC circuit 2 includes a series connection circuit having a resistor R1 and a resistor R2, and one of the ends of the resistor R1 is connected to the terminal a and one of the ends of the resistor R2 is grounded. Moreover, a node P4 (a voltage V4) of the resistors R1 and R2 is connected to an input terminal on the positive side of a comparator (CMP1).

Furthermore, the IC circuit 2 has a series connection circuit including a resistor R3, an FET (T2) and a resistor R5, and one of the ends of the resistor R3 is connected to the terminal a and one of the ends of the resistor R5 is grounded. A node P3 (a voltage V3) of the resistor R3 and the FET (T2) is connected to an input terminal on the positive side of an amplifier (AMP1) and an input terminal on the negative side of the amplifier (AMP1) is connected to the terminal d.

Moreover, the output terminal of the amplifier (AMP1) is connected to the gate of the FET (T2). Furthermore, a node P5 (a voltage V5) of the FET (T2) and the resistor R5 is connected to an input terminal on the negative side of the comparator (CMP1).

In addition, the IC circuit 2 has a driver circuit 3, and the output terminal of the driver circuit 3 is connected to the terminal c through a resistor R10. Furthermore, there is provided a current mirror circuit including transistors T3 and T4, and the transistor T3 has a collector connected to the terminal a through a resistor R4 and the transistor T4 has a collector connected to the terminal d, that is, an input terminal (a node P6, a voltage V6) on the negative side of the amplifier (AMP1), and each of the transistors T3 and T4 has an emitter grounded.

The output terminal of the comparator (CMP1) is output as an overcurrent detecting signal to an overcurrent protecting circuit which is not shown, and has the function of outputting a driving stop command to the driver circuit 3 when an overcurrent is detected.

The resistors R1 and R2 constitute a reference voltage generating circuit, the resistors R4 and R6 and the transistors T3 and T4 constitute a voltage drop generating circuit, the resistors R3 and R5, the FET (T2) and the amplifier (AMP1) constitute a decision voltage generating circuit, and the comparator (CMP1) constitutes a comparing circuit. Furthermore, the resistor R4 and the transistors T3 and T4 constitute a constant current generating circuit.

Next, description will be given to the function of the overcurrent detecting device according to the embodiment which is constituted as described above. When a driving signal is output to the FET (T1) under control of the driver circuit 3, the FET (T1) is turned ON so that a current ID flows and the load 1 is thus driven. At the same time, a current I1 flows to the series connection circuit including the resistor R3, the FET (T2) and the resistor R5.

The voltage V3 on the point P3 is input to the input terminal on the positive side of the amplifier (AMP1) and the voltage V6 on the terminal d, that is, the point P6 is input to the input terminal on the negative side of the amplifier (AMP1). An output signal corresponding to a difference (V3−V6) between these voltages is output to the gate of the FET (T2), and the current I1 is controlled in such a manner that the difference value is zero, that is, the voltage V3 and the voltage V6 are equal to each other. Accordingly, the total of a voltage VDS between the drain and the source in the FET (T1) and a voltage on both ends of the resistor R6 is controlled to be equal to a voltage generated on both ends of the resistor R3.

Furthermore, the current I1 also flows to the resistor R5 connected in series to the resistor R3. Therefore, a voltage having a magnitude, which is proportional to the resistance values of the resistors R3 and R5, is generated across the resistor R3 and R5 respectively. For example, in the case in which the resistor R3 has a resistance value of 100Ω and the resistor R5 has a resistance value of 10KΩ, the voltage V5 generated on the resistor R5 has a magnitude which is 100 times as great as the voltage generated on both ends of the resistor R3.

Accordingly, the voltage V5 is equal to a voltage obtained by amplifying the total of the voltage VDS and the voltage generated on both ends of the resistor R6. When an overcurrent is generated in the load circuit so that the voltage VDS is increased, the voltage V5 is raised. When the voltage V5 is higher than the reference voltage V4, the output signal of the comparator (CMP1) is inverted to detect the generation of the overcurrent. The driver circuit 3 can block the supply of the driving signal to the FET (T1) upon receipt of an overcurrent detecting signal to turn OFF the FET (T1), thereby protecting the load circuit from the overcurrent.

As described in the background art, moreover, when the type of the FET (T1) is varied corresponding to the load 1 to be controlled, the ON-state resistance Ron is changed. Accordingly, the voltage VDS between the drain and the source which is indicated as Ron*ID is also varied for each unit.

Description will be given to a technique for disconnecting a circuit with an overcurrent which always has an equal magnitude also in the case in which a variation is generated on the ON-state resistance Ron of the FET (T1).

As described above, the current mirror including the resistor R4 and the transistors T3 and T4 is provided in the IC circuit 2. Since the voltage V1 of the DC power supply VB is applied to the resistor R4, a current I2 flows. In this case, the current I2 can be expressed in the following equation (3).

$$I2 = (V1-0.6)/R4 \quad (3)$$

A voltage between the base and the emitter in the transistor T3 is set to be 0.6V.

Accordingly, the current I2 is a constant current determined by the voltage V1 and the resistor R4, and the collector current of the transistor T4 is equal to the current I2 by the current mirror circuit formed by the transistors T3 and T4. In this case, the collector current of the transistor T4 flows through the resistor R6. Consequently, a voltage drop of R6*I2 is generated in the resistor R6.

As described above, the current I1 is controlled in such a manner that the total of the voltage VDS between the drain and the source in the FET (T1) and the voltage generated on both ends of the resistor R6, that is, R6*I2 is equal to the voltage generated on both ends of the resistor R3. Therefore, the following equation (4) is formed.

$$V1-V3 = VDS + R6*I2 \quad (4)$$

When R5/R3=m is set, the following equation (5) can be obtained.

$$V5 = m(VDS + R6*I2) \quad (5)$$
$$= m(Ron*ID + R6*I2)$$

When a current value in a decision that the current ID flowing to the load circuit is an overcurrent is set to be an overcurrent decision value Iovc, it is necessary to invert the output of the comparator (CMP1) with ID=Iovc. Therefore, V5=V4 is obtained with ID=Iovc. Accordingly, the following equation (6) is obtained from the equation (5).

$$V5=m(Ron*Iovc+R6*I2)=V4 \quad (6)$$

By transforming the equation (6), it is possible to obtain the following equation (7).

$$Iovc=(V4/m-R6*I2)/Ron \quad (7)$$

In the equation (7), V4, m and I2 represent characteristic values set by the circuits in the IC circuit 2. However, the resistor R6 is provided on the outside of the IC circuit 2. By selecting the value of the resistor R6 for a change in Ron, therefore, it is possible to regulate the current value Iovc in the decision of an overcurrent.

Figure 2:
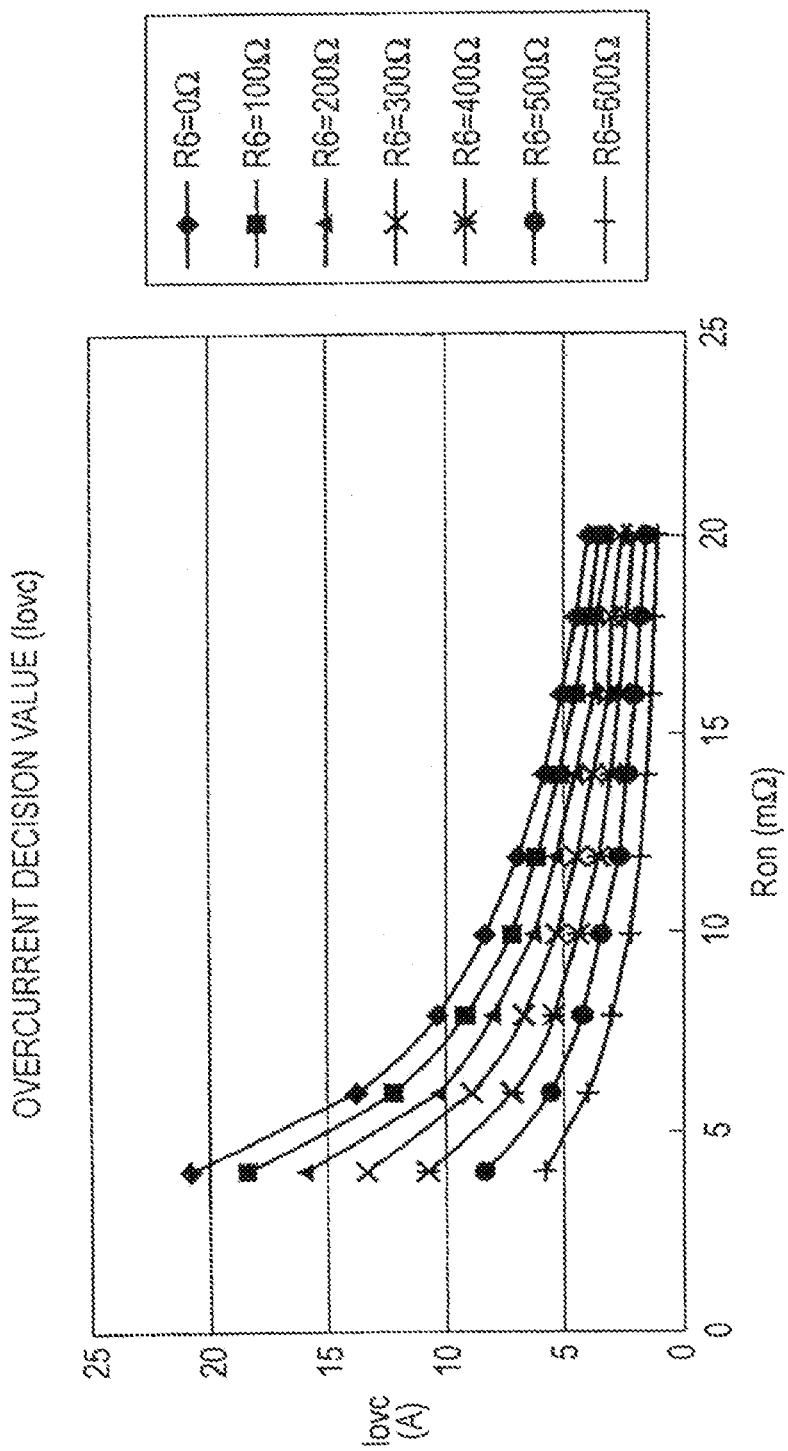
FIG. 2 is a characteristic chart showing a relationship between an ON-state resistance Ron and an overcurrent decision value Iovc in a change in the value of a resistor R6 on a unit of 100Ω from 0 to 600Ω.

Next, description will be given to a technique for setting the value of the resistor R6 from the overcurrent decision value Iovc and the ON-state resistance Ron of the FET (T1). FIG. 2 is a characteristic chart showing a relationship between the ON-state resistance Ron and the overcurrent decision value Iovc in a change in the value of the resistor R6 on a unit of 100106 from 0 to 600Ω. There are set R1=20KΩ, R2=40KΩ, R3=100Ω, R4=120KΩ, R5=10KΩ, and V1=12.5V.

A curve of R6=0Ω indicates the case in which the function of regulating an overcurrent decision value is not provided. When the IC circuit 2 is fixed, a relationship between the ON-state resistance Ron and the overcurrent decision value Iovc is determined uniquely. More specifically, if the ON-state resistance Ron is determined, the overcurrent decision value Iovc is determined so that there is no degree of freedom for setting the overcurrent decision value Iovc.

In the embodiment, there is provided the regulating function of variously changing the value of the resistor R6. When the resistor R6 is selected within a range of 0 to 600Ω, it is possible to properly select the overcurrent decision value Iovc for the same ON-state resistance Ron. For example, in the case in which the FET (T1) having Ron=4 mΩ is used, it is possible to set an optional overcurrent decision value within a range of Iovc=5.96 to 20.8 A.

As shown in FIG. 2, the regulating range is reduced (a range of 5A or less) when the ON-state resistance Ron is increased, and the overcurrent decision value Iovc having a great value cannot be selected. A great ON-state resistance Ron implies a small FET capacity. In the first place, a large current cannot be caused to flow. Accordingly, an overcurrent decision value of 5A or less is enough.

In the overcurrent detecting device according to the embodiment, thus, the current mirror including the transistors T3 and T4 is provided in the IC circuit 2, and a current which is equal to the current I2 flowing to the resistor R4 flows to the resistor R6 provided on the outside of the IC circuit 2. For this reason, a voltage drop to be I2*R6 is generated in the resistor R6 and the voltage V5 for deciding an overcurrent is generated by using the voltage V6 obtained by decreasing the voltage drop from the source voltage V2 of the FET (T1). By properly changing the value of the resistor R6, therefore, it is possible to regulate the overcurrent decision value Iovc of the load circuit optionally.

Figure 3:
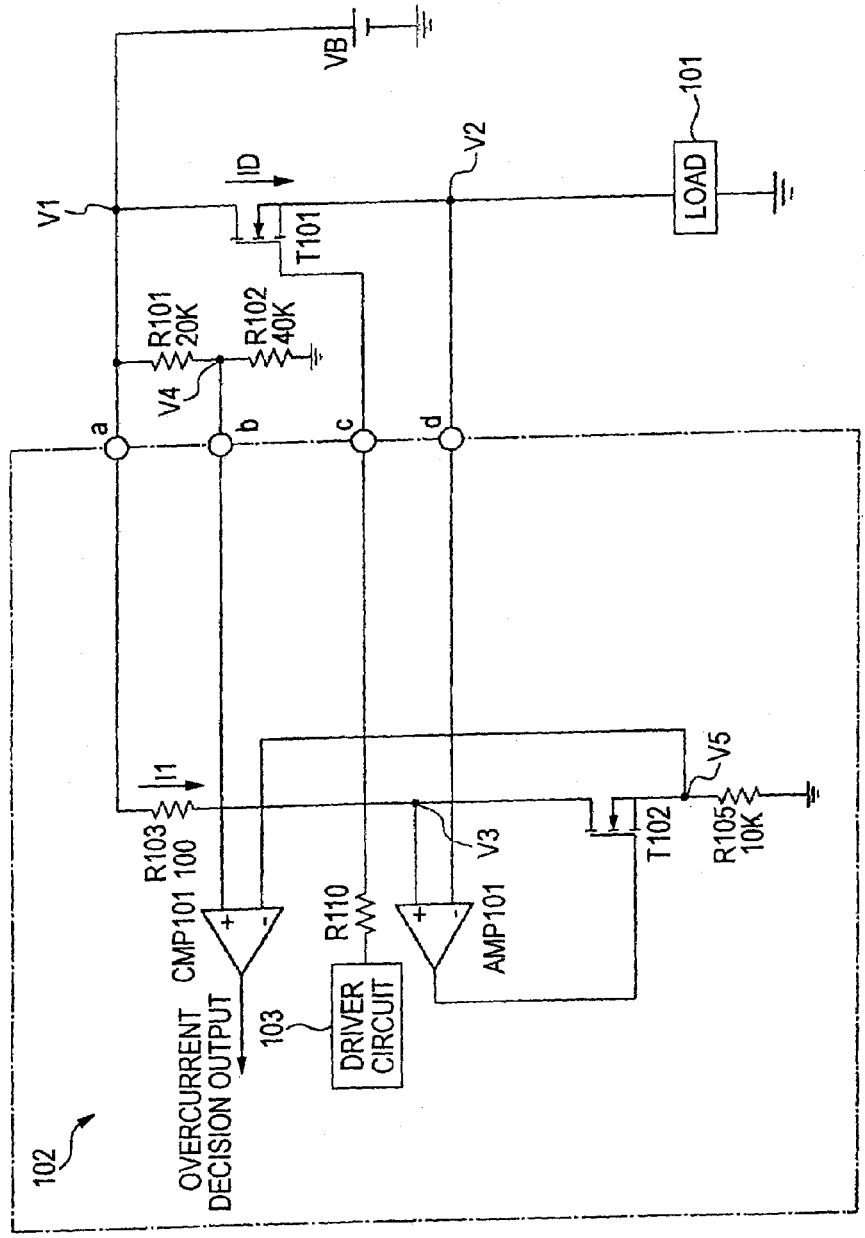
FIG. 3 is a circuit diagram showing an overcurrent detecting device and a load circuit according to the related art.

Also in the case in which the ON-state resistance Ron of the FET (T1) is changed, accordingly, it is possible to always set the value of the resistor R6 to have a desirable overcurrent decision value Iovc by regulating the same value. As compared with the circuit of FIG. 3 described in the background art, moreover, the connecting terminals of the IC circuit 2 and the load circuit are decreased. More specifically, the IC circuit 102 includes four terminals a to d in the circuit shown in FIG. 3, while the IC circuit 2 includes three terminals a, c and d (the first to third terminals) in the circuit shown in FIG. 1 according to the embodiment.

Therefore, it is possible to decrease the number of the terminals provided in the IC circuit 2 and to reduce the size of a package in the IC circuit 2, thereby reducing a cost. Moreover, the number of components to be provided on the outside of the IC circuit 2 is only one, that is, the resistor R6. Therefore, it is possible to reduce the number of the components.

Also in the case in which various semiconductor units having different ON-state resistances Ron are used, they are very useful for a technique to reliably disconnect a circuit with a predetermined overcurrent value.

What is claimed is:

1. An overcurrent detecting device for detecting an overcurrent in a load circuit, the overcurrent detecting device comprising:
    a DC power supply;
    a load;
    a semiconductor switch that controls ON/OFF of the load;
    a driver circuit that outputs a driving signal to the semiconductor switch;
    a reference voltage generating circuit that generates a reference voltage;
    a voltage drop generating circuit that includes a resistor for generating a voltage drop and a constant current circuit that causes a constant current to flow from the source terminal of the semiconductor switch through the resistor for generating a voltage drop so as to generate a desired voltage drop in the resistor;
    a decision voltage generating circuit that generates, as a decision voltage, a voltage corresponding to a voltage obtained by adding a voltage drop generated in the resistor to a voltage drop generated when the semiconductor switch is turned ON; and
    a comparing circuit that compares the decision voltage with the reference voltage and outputs a disconnecting command signal of the semiconductor switch to the driver circuit when the decision voltage is greater than the reference voltage.

2. The overcurrent detecting device according to claim 1, wherein the driver circuit, the reference voltage generating circuit, the comparing circuit, the decision voltage generating circuit, and the voltage drop generating circuit excluding the resistor for generating a voltage drop, are provided in a single integrated circuit.

3. The overcurrent detecting device according to claim 2, wherein the integrated circuit includes three connecting terminals having a first terminal for connecting the driver circuit to the semiconductor switch, a second terminal for connecting the reference voltage generating circuit to the DC power supply, and a third terminal for connecting the resistor for generating a voltage drop to the voltage drop generating circuit provided in the integrated circuit.

4. The overcurrent detecting device according to claim 1, wherein the semiconductor switch is an MOSFET.

\* \* \* \* \*